(12) United States Patent
Carey et al.

(10) Patent No.: US 7,674,637 B2
(45) Date of Patent: Mar. 9, 2010

(54) MONITORING COOL-DOWN STRESS IN A FLIP CHIP PROCESS USING MONITOR SOLDER BUMP STRUCTURES

(75) Inventors: Charles F. Carey, Endicott, NY (US); Bernt Julius Hansen, Afton, NY (US); Ashwani K. Malhotra, LaGrangeville, NY (US); David L. Questad, Hopewell Junction, NY (US); Wolfgang Sauter, Richmond, VT (US)

(73) Assignee: International Business Machines Corporation, Armonk, NY (US)

( * ) Notice: Subject to any disclaimer, the term of this patent is extended or adjusted under 35 U.S.C. 154(b) by 369 days.

(21) Appl. No.: 11/749,885

(22) Filed: May 17, 2007

(65) Prior Publication Data

US 2008/0286886 A1 Nov. 20, 2008

(51) Int. Cl.
*G01L 31/26* (2006.01)
*H01L 21/66* (2006.01)
(52) U.S. Cl. .................. 438/15; 257/737; 257/E21.521
(58) Field of Classification Search .................. 438/15; 257/737, 738
See application file for complete search history.

(56) References Cited

U.S. PATENT DOCUMENTS 6,979,600 B2 * 12/2005 Brandenburger ............ 438/127
2008/0113457 A1 * 5/2008 Tsay et al. ................... 438/15

* cited by examiner

*Primary Examiner*—Phat X Cao
*Assistant Examiner*—Nga Doan
(74) *Attorney, Agent, or Firm*—Schmeiser, Olsen & Watts; Richard M. Kotulak

(57) ABSTRACT

A semiconductor chip and methods for forming the same. The semiconductor chip includes M regular solder bump structures and N monitor solder bump structures, M and N being positive integers. If a flip chip process is performed for the semiconductor chip, then the N monitor solder bump structures are more sensitive to a cool-down stress than the M regular solder bump structures. The cool-down stress results from a cool-down step of the flip chip process. Each of the M regular solder bump structures is electrically connected to either a power supply or a device of the semiconductor chip. Each of the N monitor solder bump structures is not electrically connected to a power supply or a device of the semiconductor chip.

12 Claims, 4 Drawing Sheets

MONITORING COOL-DOWN STRESS IN A FLIP CHIP PROCESS USING MONITOR SOLDER BUMP STRUCTURES

FIELD OF THE INVENTION

The present invention relates to monitoring cool-down stress of a flip chip process, and more specifically, to monitoring the cool-down stress of the flip chip process using monitor solder bump structures.

BACKGROUND OF THE INVENTION

During a conventional flip chip process, stress may occur in solder bump structures resulting in cracks beneath solder bumps of the solder bump structures. Therefore, there is a need for a method and structure for monitoring the cool-down stress of the flip chip process using monitor solder bump structures.

SUMMARY OF THE INVENTION

The present invention provides a structure stress monitoring scheme, comprising providing a semiconductor chip which includes: (a) M regular solder bump structures, and (b) N monitor solder bump structures, wherein M and N are positive integers, wherein each regular solder bump structure of the M regular solder bump structures is electrically connected to either a power supply or a device of the semiconductor chip, and wherein each monitor solder bump structure of the N monitor solder bump structures is not electrically connected to a power supply or a device of the semiconductor chip; performing a flip chip process for the semiconductor chip resulting in P monitor solder bump structures of the N monitor solder bump structures being cracked, wherein P is a positive integer not greater than N, wherein the N monitor solder bump structures are more sensitive to a cool-down stress than the M regular solder bump structures, and wherein the cool-down stress results from a cool-down step of the flip chip process; determining a value of P; specifying a maximum acceptable number Q of cracked monitor solder bump structures of the N monitor solder bump structures, wherein Q is a positive integer smaller than N; if the value of P is equal to or smaller than Q, then determining that the cool-down stress resulting from the flip chip process is low and acceptable; and if the value of P is greater than Q, then determining that the cool-down stress resulting from the flip chip process is too high and unacceptable.

The present invention provides a method and structure for monitoring the cool-down stress of the flip chip process using monitor solder bump structures.

DETAILED DESCRIPTION OF THE INVENTION

Figure 1:
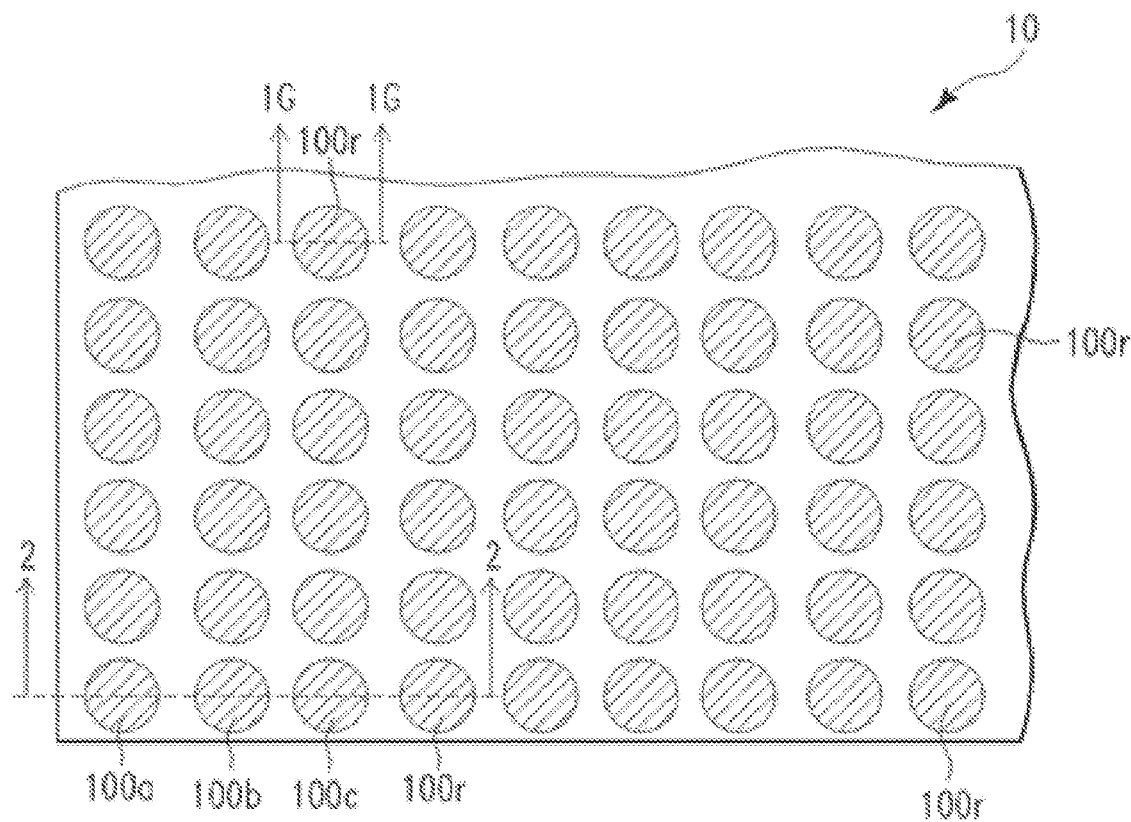
FIG. 1 shows a top-down view of a semiconductor chip, in accordance with embodiments of the present invention.

FIG. 1 shows a top-down view of a semiconductor chip 10, in accordance with embodiments of the present invention.

More specifically, the semiconductor chip 10 comprises multiple regular solder bump structures 100r and monitor solder bump structures 100a, 100b, and 100c. The multiple regular solder bump structures 100r are electrically connected to power supplies (ground, VDD) (not shown) and devices (not shown) of the chip 10, whereas the monitor solder bump structures 100a, 100b, and 100c are not electrically connected to the power supplies or the devices of the chip 10. The regular solder bump structures 100r and the monitor solder bump structures 100a, 100b, and 100c are simultaneously formed in a similar manner at top of the semiconductor chip 10. The monitor solder bump structures 100a, 100b, and 100c are structurally similar to the regular solder bump structure 100r, except for some differences as described below with reference to FIG. 2. In one embodiment, the monitor solder bump structures 100a, 100b, and 100c are at a corner of the semiconductor chip 10 (as shown in FIG. 1). The regular solder bump structures 100r and the monitor solder bump structures 100a, 100b, and 100c can be collectively referred to as solder bump structures 100.

FIGS. 1A-1G (cross-section views) illustrate a fabrication process for forming a solder bump structure 100 of the semiconductor chip 10 of FIG. 1, in accordance with embodiments of the present invention. More specifically, with reference to FIG. 1A, the fabrication of the solder bump structure 100 starts with a top interconnect layer 102 of the semiconductor chip 10 including (i) a dielectric layer 110, and (ii) an electrically conductive line 112 (comprising copper (Cu) in one embodiment) embedded in the dielectric layer 110. There are additional interconnect layers beneath and electrically coupled to the top interconnect layer 102, but these additional interconnect layers are not shown for simplicity.

Next, in one embodiment, a hole 116 is created in the dielectric layer 110 resulting in a top surface 114 of the Cu line 112 being exposed to the surrounding ambient.

Next, in one embodiment, a bond pad 120 (comprising aluminum (Al) in one embodiment) is formed on top of the Cu line 112 and the dielectric layer 110 such that the Al bond pad 120 (i) fills the hole 116, and (ii) is electrically coupled to the Cu line 112. Illustratively, the Al bond pad 120 can be formed by (a) forming an Al layer (not shown) on the entire structure 100 including in the hole 116, and then (b) directionally and selectively etching back the Al layer stopping at the dielectric layer 110. The directional and selective etching in step (b) may be performed using traditional lithographic and etching processes such that what remains of the Al layer after the etching is the Al bond pad 120 (as shown in FIG. 1A).

Figure 1A:
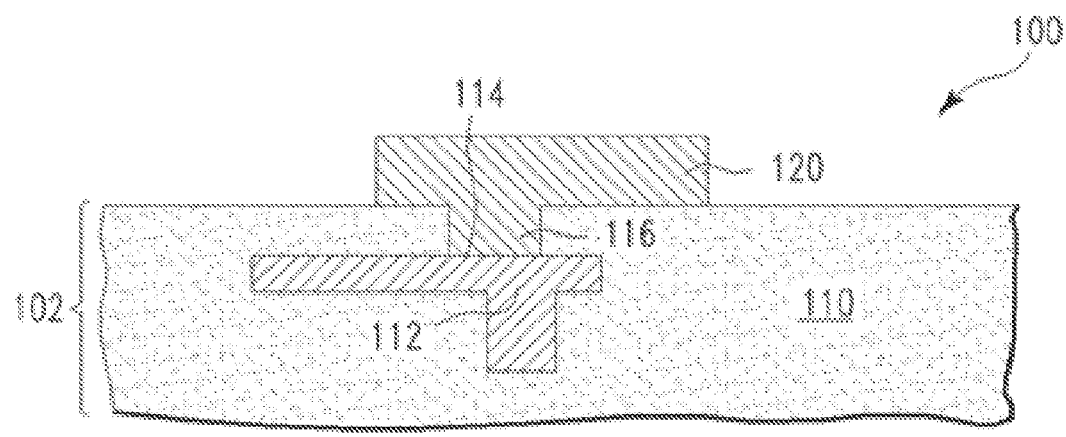
FIGS. 1A-1G (cross-section views) illustrate a fabrication process for forming a solder bump structure of the semiconductor chip of FIG. 1, in accordance with embodiments of the present invention.
Figure 1B:
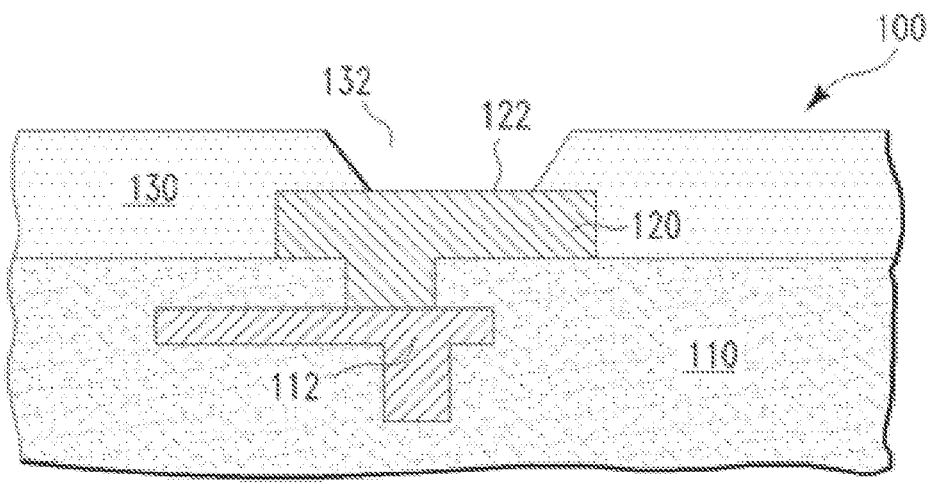

Next, with reference to FIG. 1B, in one embodiment, a photosensitive polyimide (PSPI) layer 130 (having a thickness in a range of 3-5 μm in one embodiment) is formed on top of the entire structure 100 of FIG. 1A. More specifically, the PSPI layer 130 is formed by (i) spin-applying a polyimide material on the entire structure 100 of FIG. 1A, and then (ii) curing the deposited polyimide material at a high temperature resulting in the PSPI layer 130.

Next, in one embodiment, a hole 132 is created in the PSPI layer 130 such that a top surface 122 of the Al bond pad 120 is exposed to the surrounding ambient via the hole 132. More specifically, the hole 132 is formed in the PSPI layer 130 by using a conventional lithographic process. It should be noted that polyimide is a photosensitive polymer. In general, other photosensitive polymers may be used instead of polyimide.

Figure 1C:
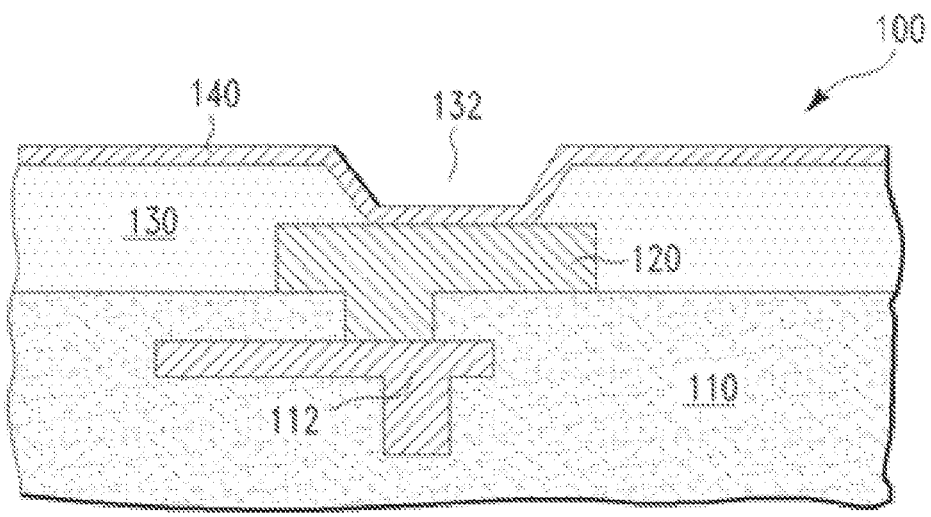

Next, with reference to FIG. 1C, in one embodiment, a bump limiting metallurgy (BLM) film 140 is formed on top of the entire structure 100 of FIG. 1B including on the bottom wall and side wall of the hole 132 such that the BLM film 140 is in direct physical contact with the Al bond pad 120. Illustratively, the BLM film 140 comprises multiple layers of copper (Cu), chrome (Cr), and gold (Au). The BLM film 140 can be formed by sputter deposition.

Figure 1D:
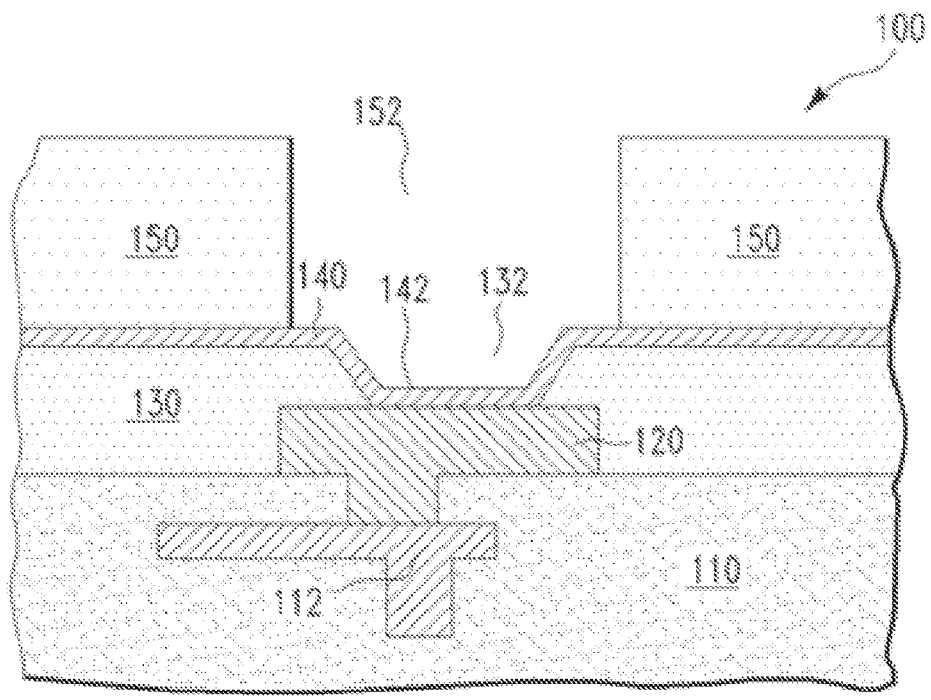

Next, with reference to FIG. 1D, in one embodiment, a patterned photo-resist layer 150 is formed on top of the BLM film 140. The patterned photo-resist layer 150 has a hole 152 aligned with and wider than the hole 132 such that a top surface 142 of the BLM film 140 is exposed to the surrounding ambient via the hole 152. It should be noted that the holes 132 and 152 can be collectively referred to as a hole 132+152. The patterned photo-resist layer 150 is formed by using a conventional lithographic process.

Figure 1E:
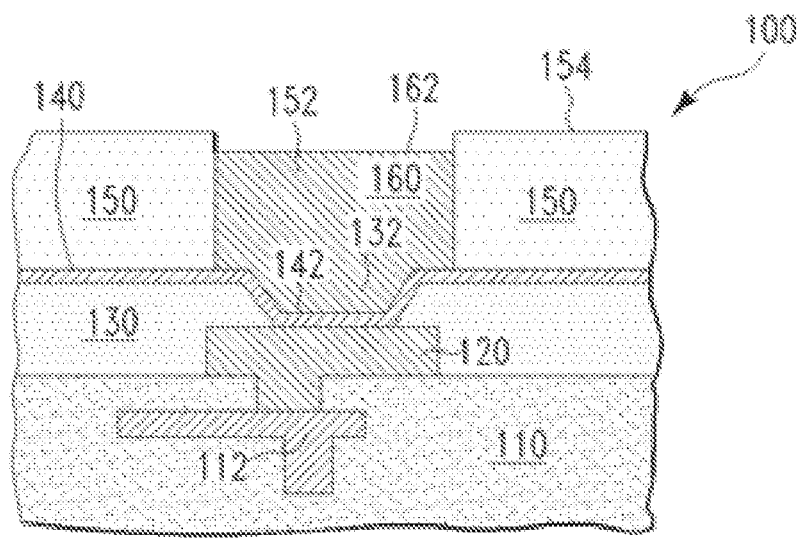

Next, with reference to FIG. 1E, in one embodiment, a solder bump 160 (comprising a mixture of silver (Ag) and tin (Sn) in one embodiment) is formed in the hole 132+152 by, illustratively, electroplating. More specifically, the structure 100 is submerged in a solution (not shown) containing tin and silver ions. The BLM film 140 is electrically coupled to the cathode of an external dc (direct current) power supply (not shown), while the solution is electrically coupled to the anode of the dc power supply. Under the electric field created in the solution by the dc power supply, tin and silver ions in the solution arrive at the exposed surface 142 of the BLM film 140 and deposit there forming the solder bump 160, as shown in FIG. 1E. The filled hole 132 of the PSPI layer 130 is called a solder bump via 132. In one embodiment, the solder bump 160 is formed such that its top surface 162 is at a lower level than a top surface 154 of the patterned photoresist layer 150. Alternatively, the solder bump 160 is formed such that its top surface 162 is at a higher level than the top surface 154 of the patterned photo-resist layer 150.

Next, in one embodiment, the patterned photoresist layer 150 is completely removed. The patterned photoresist layer 150 can be removed by wet etching.

Figure 1F:
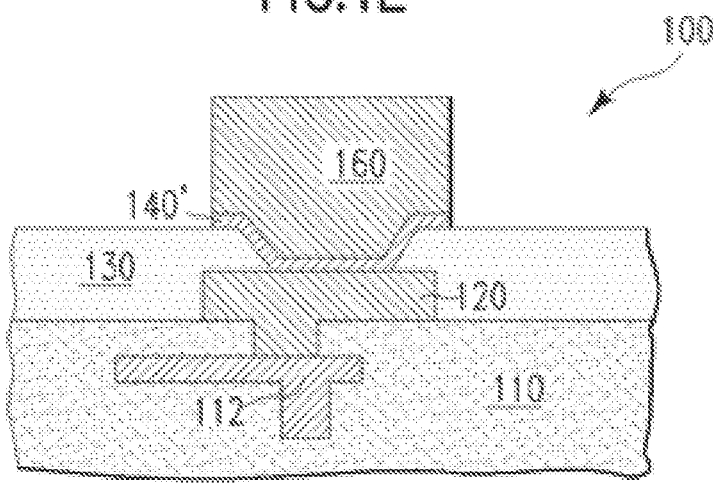

Next, in one embodiment, the BLM film 140 is etched with the solder bump 160 as a blocking mask resulting in a BLM region 140' of FIG. 1F. More specifically, the BLM film 140 is etched by using a plasma etch process. The resulting structure 100 is shown in FIG. 1F.

Figure 1G:
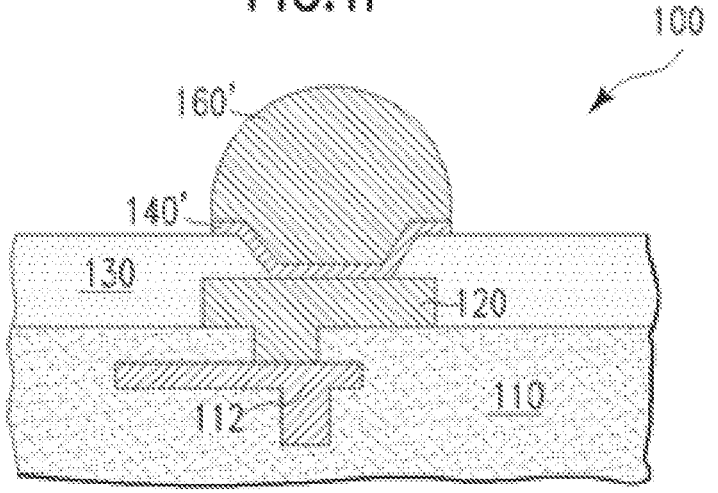

Next, in one embodiment, the solder bump 160 of FIG. 1F is reflowed at a high temperature, resulting the solder bump 160' of FIG. 1G. The resulting solder bump 160' has a half-spherical shape at its top portion. Illustratively, the solder bump 160 of FIG. 1F is reflowed by subjecting it to a temperature lower than 400° C. It should be noted that FIG. 1G is a cross-section view of a regular solder bump structure 100*r* (cross-section views of the monitor solder bump structures 100*a*, 100*b*, and 100*c* are the same) of the semiconductor chip 10 of FIG. 1 along a line 1G-1G.

After the solder bump structures 100 are formed at top of the semiconductor chip 10 using the fabrication process described above in FIGS. 1A-1G, a flip chip process is performed. More specifically, the chip 10 (in FIG. 1) is flipped upside down and aligned to an organic laminate (not shown). Then, the solder bumps 160' of the solder bump structures 100 are bonded directly, simultaneously, and one-to-one to pads (not shown) of the organic laminate at a high temperature and then cooled down.

During the cool-down step of the flip chip process described above, stress may occur in the solder bump structures 100 due to the difference in the coefficients of thermal extension (CTE) of the chip 10 and the organic laminate (not shown). This cool-down stress may cause cracks beneath the solder bumps 160' of the solder bump structures 100. In one embodiment, the cracked solder bump structures can be identified by a sonoscan after the flip chip process. More specifically, the cracked solder bump structures can be easily identified on a sonoscan result, because they show up on the sonoscan result as bright dots, whereas the intact solder bump structures show up on the sonoscan result as dark dots.

Figure 2:
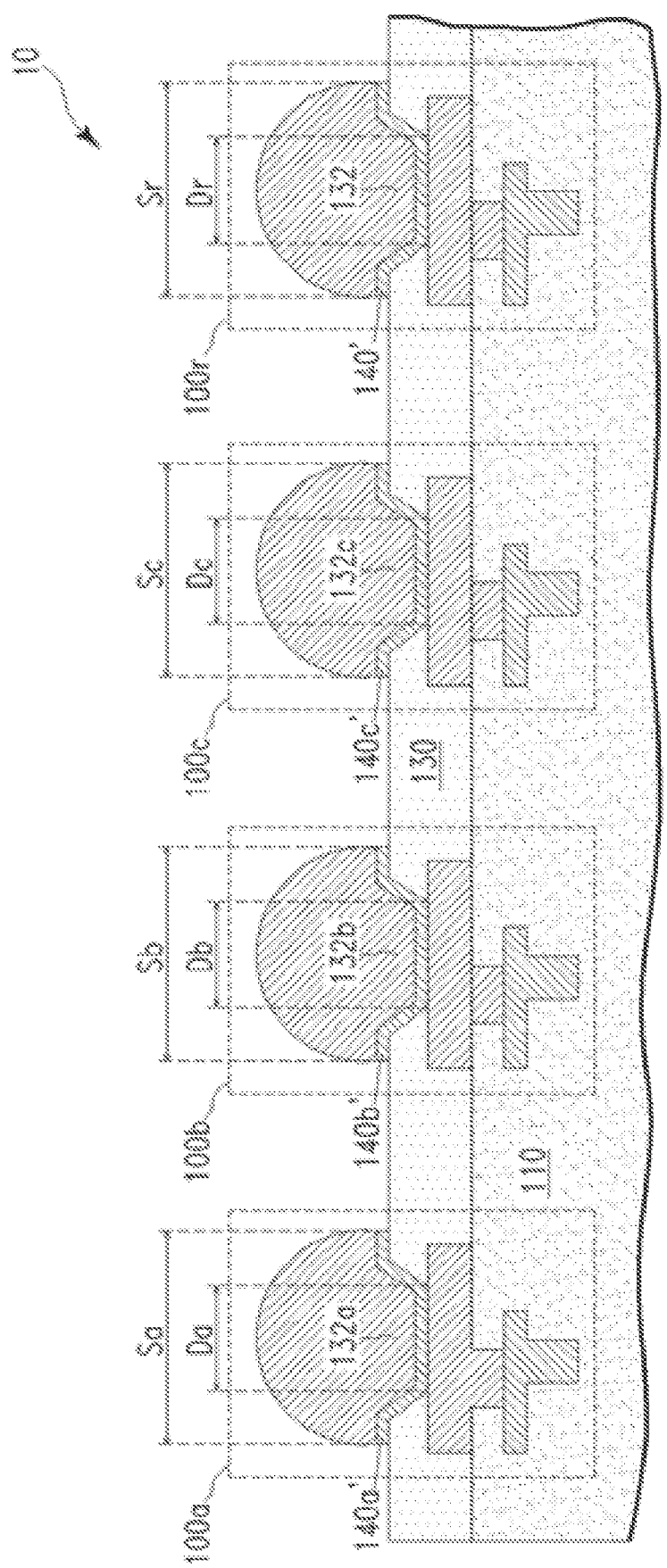
FIG. 2 shows a cross-section view of the semiconductor chip of FIG. 1 along a line 2-2, in accordance with embodiments of the present invention.

FIG. 2 shows a cross-section view of the monitor solder bump structures 100*a*, 100*b*, and 100*c* and a regular solder bump structure 100*r* of the semiconductor chip 10 of FIG. 1 along a line 2-2, in accordance with embodiments of the present invention. As can be seen in FIG. 2, the monitor solder bump structures 100*a*, 100*b*, and 100*c* share the same PSPI layer 130.

With reference to FIG. 2, in one embodiment, the diameters $D_r$, $D_a$, $D_b$, and $D_c$ of the solder bump vias 132, 132*a*, 132*b*, and 132*c*, respectively, are such that $D_r<D_a<D_b<D_c$, whereas the diameters $S_r$, $S_a$, $S_b$, and $S_c$ of BLM regions 140', 140*a*', 140*b*', and 140*c*', respectively, are such that $S_r=S_a=S_b=S_c$. The inventors of the present invention have found through modeling and experimental data that the larger the diameter of the solder bump via of the solder bump structure is, the more sensitive to the cool-down stress (more prone to the crack due to the cool-down stress) this solder bump structure becomes. As a result, the monitor solder bump structure 100*c* is more sensitive to the cool-down stress than the monitor solder bump structure 100*b*; the monitor solder bump structure 100*b* is more sensitive to the cool-down stress than the monitor solder bump structure 100*a*; and the monitor solder bump structure 100*a* is more sensitive to the cool-down stress than the regular solder bump structure 100*r*. Because of the differences in the diameters $D_a$, $D_b$, and $D_c$ of the solder bump vias 132*a*, 132*b*, and 132*c*, the number of the cracked monitor solder bump structures (identified by the sonoscan after the flip chip process) of the three monitor solder bump structures 100*a*, 100*b*, and 100*c* indicates the level of the cool-down stress endured by the solder bump structures 100 of the semiconductor chip 10 during the cool-down step of the flip chip process.

In one embodiment, multiple semiconductor chips (not shown) similar to the semiconductor chip 10 of FIG. 1 are formed and then in turn go through the same flip chip process. That is each of the multiple semiconductor chips has three monitor solder bump structures (similar to the three monitor solder bump structures 100*a*, 100*b*, and 100*c* of the semiconductor chip 10). After going through the flip chip process, assume that a first chip of the multiple semiconductor chips has only one cracked monitor solder bump structure 100*c*; that a second chip of the multiple semiconductor chips has two cracked monitor solder bump structures 100*b* and 100*c*; and that a third chip of the multiple semiconductor chips has three cracked monitor solder bump structures 100*a*, 100*b*, and 100*c*. This indicates that the cool-down stress endured by the solder bump structures 100 of the first chip is lower than the cool-down stress endured by the solder bump structures 100 of the second chip; and that the cool-down stress endured by the solder bump structures 100 of the second chip is lower than the cool-down stress endured by the solder bump structures 100 of the third chip.

In one embodiment, a structure stress monitoring scheme using the monitor solder bump structures of the multiple semiconductor chips (similar to the semiconductor chip 10 in FIG. 1) can be as follow. If a chip of the multiple semiconductor chips after going through the flip chip process has only one cracked monitor solder bump structure of the three monitor solder bump structures, then the cool-down stress endured by the solder bump structures 100 of the chip during the cool-down step of the flip chip process is considered low and production is allowed to continue (i.e., the flip chip process is acceptable). If a chip of the multiple semiconductor chips after going through the flip chip process has two cracked monitor solder bump structures of the three monitor solder bump structures, then the cool-down stress endured by the solder bump structures 100 of the chip during the cool-down step of the flip chip process is considered high but the production is allowed to continue (i.e., the flip chip process is still acceptable). If a chip of the multiple semiconductor chips after going through the flip chip process has three cracked monitor solder bump structures, then the cool-down stress endured by the solder bump structures 100 of the chip during the cool-down step of the flip chip process is considered too high and the production is stopped (i.e., the flip chip process is unacceptable).

In summary, by monitoring the monitor solder bump structures 100a, 100b, and 100c of each semiconductor chip going through the flip chip process, the level of the cool-down stress associated with the cool-down step of the flip chip process can be monitored.

In the embodiment described above, with reference to FIG. 2, $D_r < D_a < D_b < D_c$ and $S_r = S_a = S_b = S_c$. Alternatively, $D_r = D_a = D_b = D_c$ and $S_r > S_a > S_b > S_c$. The inventors of the present invention have found through modeling and experimental data that the smaller the diameter of the BLM region of the solder bump structure is, the more sensitive to the cool-down stress (more prone to the crack due to the cool-down stress) this solder bump structure becomes. As a result, the monitor solder bump structure 100c is more sensitive to the cool-down stress than the monitor solder bump structure 100b; the monitor solder bump structure 100b is more sensitive to the cool-down stress than the monitor solder bump structure 100a; and the monitor solder bump structure 100a is more sensitive to the cool-down stress than the regular solder bump structure 100r. The structure stress monitoring scheme described above can be applied to the semiconductor chip 10 formed accordant to this alternative embodiment. More specifically, if there are less than three cracked monitor solder bump structures in a chip, then the production is allowed to continue (i.e., the flip chip process is acceptable). If there are more than two cracked monitor solder bump structures in a chip, then the production is stopped (i.e., the flip chip process is unacceptable).

In the embodiments described above, with reference to FIG. 1, each semiconductor chip has only three monitor solder bump structures 100a, 100b, and 100c. In general, each semiconductor chip has N monitor solder bump structures, wherein N is a positive integer.

In the embodiments described above, with reference to FIG. 1, the monitor solder bump structures 100a, 100b, and 100c are at a corner of the semiconductor chip 10. In general, the monitor solder bump structures 100a, 100b, and 100c can be at anywhere of the chip 10.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. A structure stress monitoring method, comprising:
   providing a semiconductor chip which includes M regular solder bump structures and N monitor solder bump structures, wherein M and N are positive integers, wherein each regular solder bump structure of the M regular solder bump structures is electrically connected to either a power supply or a device of the semiconductor chip, and wherein each monitor solder bump structure of the N monitor solder bump structures is not electrically connected to a power supply or a device of the semiconductor chip;
   performing a flip chip process for the semiconductor chip resulting in P monitor solder bump structures of the N monitor solder bump structures being cracked, wherein P is a positive integer not greater than N, wherein the N monitor solder bump structures are more sensitive to a cool-down stress than the M regular solder bump structures, and wherein the cool-down stress results from a cool-down step of the flip chip process;
   determining a value of P;
   specifying a maximum acceptable number Q of cracked monitor solder bump structures of the N monitor solder bump structures, wherein Q is a positive integer smaller than N;
   if the value of P is equal to or smaller than Q, then determining that the cool-down stress resulting from the flip chip process is low and acceptable; and
   if the value of P is greater than Q, then determining that the cool-down stress resulting from the flip chip process is too high and unacceptable.

2. The method of claim 1, further comprising not performing the flip chip process for another semiconductor chip, if it is determined that the cool-down stress resulting from the flip chip process is too high and unacceptable.

3. The method of claim 1, further comprising performing the flip chip process for other semiconductor chips, if it is determined that the cool-down stress resulting from the flip chip process is low and acceptable.

4. The method of claim 1, wherein each solder bump structure of the N monitor solder bump structures and the M regular solder bump structures comprises:
   a bond pad;
   a BLM (Bump Limiting Metallurgy) region on top of the bond pad, wherein the BLM region has a BLM region diameter; and
   a solder bump on top of the BLM region, wherein the solder bump includes a solder bump via having a solder bump via diameter.

5. The method of claim 4,
   wherein for i=1, ..., N and for j=1, ..., M, a solder bump via diameter of an $i^{th}$ monitor solder bump structure of the N monitor solder bump structures is greater than a solder bump via diameter of a $j^{th}$ regular solder bump structure of the M regular solder bump structures, and
   wherein a BLM region diameter of the $i^{th}$ monitor solder bump structure is equal to a BLM region diameter of the $j^{th}$ regular solder bump structure.

6. The method of claim 5, wherein no two monitor solder bump structures of the N monitor solder bump structures has a same solder bump via diameter.

7. The method of claim 4,
   wherein for i=1, ..., N and for j=1, ..., M, a BLM region diameter of an $i^{th}$ monitor solder bump structure of the N monitor solder bump structures is smaller than a BLM region diameter of a $j^{th}$ regular solder bump structure of the M regular solder bump structures, and
   wherein a solder bump via diameter of the $i^{th}$ monitor solder bump structure is equal to a solder bump via diameter of the $j^{th}$ regular solder bump structure.

8. The method of claim 7, wherein no two monitor solder bump structures of the N monitor solder bump structures has a same BLM region diameter.

9. The method of claim 1, wherein said determining the value of P comprises:
- scanning the semiconductor chip by a sonoscan resulting in a sonoscan result; and then
- determining the value of P to be the number of monitor solder bump structures of the N monitor solder bump structures that show up as bright dots on the sonoscan result.

10. The method of claim 1, wherein the N monitor solder bump structures are located at a corner of the semiconductor chip.

11. The method of claim 1, wherein N=3.

12. The method of claim 11, wherein Q=2.

* * * * *